(12) United States Patent
Zhu et al.

(10) Patent No.: US 7,732,874 B2
(45) Date of Patent: Jun. 8, 2010

(54) FINFET STRUCTURE USING DIFFERING GATE DIELECTRIC MATERIALS AND GATE ELECTRODE MATERIALS

(75) Inventors: Huilong Zhu, Poughkeepsie, NY (US); Bruce B. Doris, Brewster, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 11/847,573

(22) Filed: Aug. 30, 2007

(65) Prior Publication Data

US 2009/0057765 A1    Mar. 5, 2009

(51) Int. Cl.
*H01L 29/423* (2006.01)

(52) U.S. Cl. ............... 257/401; 257/402; 257/E29.135; 438/283

(58) Field of Classification Search ........................ None
See application file for complete search history.

(56) References Cited

U.S. PATENT DOCUMENTS

| | | | |
|---|---|---|---|
| 6,653,698 B2 | | 11/2003 | Lee et al. |
| 6,794,234 B2 | | 9/2004 | Polishchuk et al. |
| 6,924,561 B1 | * | 8/2005 | Hill et al. ................. 257/401 |
| 7,224,029 B2 | * | 5/2007 | Anderson et al. .......... 257/347 |
| 7,230,287 B2 | * | 6/2007 | Anderson et al. .......... 257/213 |
| 7,250,658 B2 | * | 7/2007 | Doris et al. ............... 257/350 |
| 2005/0148137 A1 | * | 7/2005 | Brask et al. .............. 438/216 |
| 2006/0044915 A1 | * | 3/2006 | Park et al. ................ 365/222 |

* cited by examiner

*Primary Examiner*—Sue Purvis
*Assistant Examiner*—Benjamin P Sandvik
(74) *Attorney, Agent, or Firm*—Scully, Scott, Murphy & Presser, P.C.; H. Daniel Schnurmann

(57) ABSTRACT

A semiconductor structure includes a first finFET and a second finFET. The first finFET and the second finFET may comprise an n-finFET and a p-finFET to provide a CMOS finFET structure. Within the semiconductor structure, at least one of: (1) a first gate dielectric within the first finFET and a second gate dielectric within the second finFET comprise different gate dielectric materials; and/or (2) a first gate electrode within the first finFET and a second gate electrode within the second finFET comprise different gate electrode materials.

16 Claims, 11 Drawing Sheets

FINFET STRUCTURE USING DIFFERING GATE DIELECTRIC MATERIALS AND GATE ELECTRODE MATERIALS

BACKGROUND

1. Field of the Invention

The invention relates generally to finFET structures. More particularly, the invention relates to finFET structures with enhanced performance.

2. Description of the Related Art

Semiconductor structures include both passive semiconductor devices such as resistors and capacitors, as well as active devices such as transistors and diodes. Field effect transistor devices are common transistor devices within semiconductor structures. Field effect transistor devices are often fabricated in complementary pairs to provide complementary metal oxide semiconductor (CMOS) structures. CMOS structures and CMOS devices are desirable insofar as CMOS structures and CMOS devices generally consume less power than other transistor structures and transistor devices.

Field effect transistor structure and device dimensions have been scaled effectively to increasingly smaller dimensions over the period of several decades. While such scaling is projected to continue, nonetheless field effect transistor performance improvements as a function of field effect transistor scaling are becoming more difficult to achieve. To that end, materials of construction of field effect transistors are now often routinely selected and controlled in an effort to provide additional avenues to enhance field effect transistor performance.

Various field effect transistor structures having desirable properties, including in particular CMOS structures, are known in the semiconductor fabrication art.

For example, Lee et al., in U.S. Pat. No. 6,653,698, teaches a CMOS structure that provides individual n-FET and p-FET devices having individual work functions. To realize such a CMOS structure, the individual n-FET and p-FET gate electrodes are fabricated at least in part from different metal gate materials.

In addition, Polischuk et al., in U.S. Pat. No. 6,794,234, also teaches a CMOS structure that provides individual n-FET and p-FET devices having individual work functions. To realize such as CMOS structure, the individual n-FET and p-FET gate electrodes are fabricated at least in part from different interdiffused metal gate materials.

Semiconductor device and semiconductor structure dimensions are certain to continue to decrease as semiconductor technology advances. Thus, desirable are novel semiconductor devices and semiconductor structures, including in particular CMOS devices and CMOS structures, that provide for enhanced performance.

SUMMARY

The invention provides a semiconductor structure and a method for fabricating the semiconductor structure. The semiconductor structure includes in particular a first finFET structure and a second finFET structure that in an aggregate may comprise a CMOS finFET structure. Within the semiconductor structure in accordance with the invention with respect to the first finFET structure and the second finFET structure, the first finFET structure and the second finFET structure are fabricated using at least one, and preferably both, of a different gate dielectric material and a different gate electrode material (i.e., a different gate dielectric material and/or a different gate electrode material).

A particular semiconductor structure in accordance with the invention includes a first finFET that includes a first semiconductor fin located over a substrate, a first gate dielectric located upon the first semiconductor fin and a first gate electrode located to straddle the first semiconductor fin to provide a first channel region beneath the first gate electrode that separates a plurality of source and drain regions within the first semiconductor fin. This particular semiconductor structure also includes a second finFET that includes a second semiconductor fin located over the substrate, a second gate dielectric located upon the second semiconductor fin and a second gate electrode located to straddle the second semiconductor fin to provide a second channel region beneath the second gate electrode that separates a plurality of source and drain regions within the second semiconductor fin. Within this particular semiconductor structure, at least either: (1) the first gate dielectric and the second gate dielectric comprise different gate dielectric materials; or (2) the first gate electrode and the second gate electrode comprise different gate electrode materials.

A particular method for fabricating a semiconductor structure in accordance with the invention includes forming over a substrate a first finFET that includes a first semiconductor fin formed over the substrate, a first gate dielectric formed upon the first semiconductor fin and a first gate electrode formed to straddle the first semiconductor fin to provide a first channel region beneath the first gate electrode that separates a plurality of source and drain regions within the first semiconductor fin. This particular method also includes forming over the substrate a second finFET that includes a second semiconductor fin formed over the substrate, a second gate dielectric formed upon the second semiconductor fin and a second gate electrode formed to straddle the second semiconductor fin to provide a second channel region beneath the second gate electrode that separates a plurality of source and drain regions within the second semiconductor fin. Within this particular method, at least either: (1) the first gate dielectric and the second gate dielectric comprise different gate dielectric materials; or (2) the first gate electrode and the second gate electrode comprise different gate electrode materials.

Another particular method for fabricating a semiconductor structure in accordance with the invention includes forming a first semiconductor fin and a second semiconductor fin over a substrate. This other particular method also includes forming a first gate dielectric upon the first semiconductor fin and a first gate electrode upon the first gate dielectric to define the locations of a channel and a plurality of source and drain regions within the first semiconductor fin. This particular method also includes forming a second gate dielectric different than the first gate dielectric upon the second semiconductor fin and a second gate electrode different than the first gate electrode upon the second gate dielectric, to define the locations of a channel and a plurality of source and drain regions within the second semiconductor fin.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENTS

The invention, which includes a semiconductor structure and a method for fabricating the semiconductor structure, is understood within the context of the description set forth below. The description set forth below is understood within the context of the drawings described above. Since the drawings are intended for illustrative purposes, the drawings are not necessarily drawn to scale.

Figure 1:
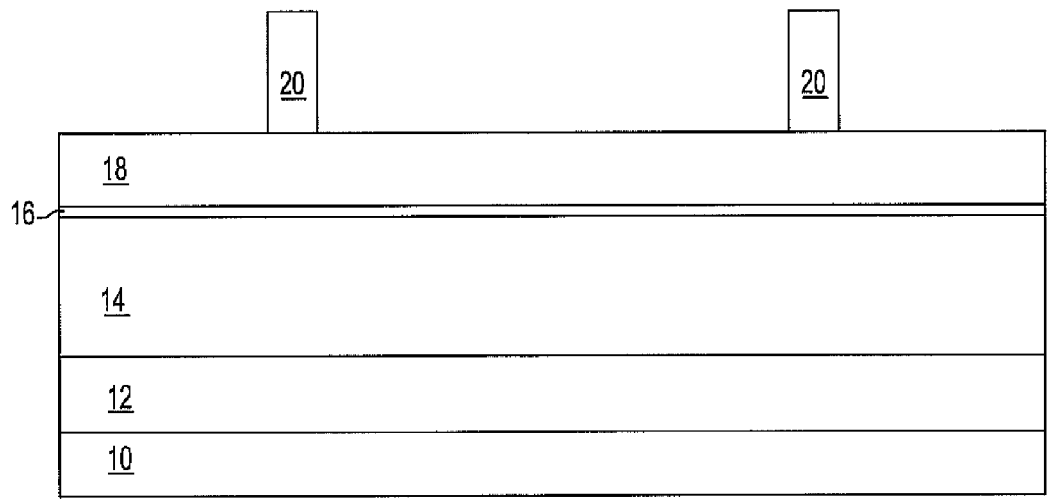
FIG. 1 to FIG. 12B show a series of schematic cross-sectional and plan-view diagrams illustrating the results of progressive stages in fabricating a semiconductor structure in accordance with a first embodiment of the invention.

FIG. 1 to FIG. 12B show a series of schematic cross-sectional diagrams illustrating the results of progressive stages in fabricating a semiconductor structure in accordance with a particular embodiment of the invention. This particular embodiment of the invention comprises a first embodiment of the invention. FIG. 1 shows a schematic cross-sectional diagram of the semiconductor structure at an early stage in the fabrication thereof in accordance with this particular embodiment.

FIG. 1 shows a base semiconductor substrate 10. A buried dielectric layer 12 is located upon the base semiconductor substrate 10, and a surface semiconductor layer 14 is located upon the buried dielectric layer 12. In an aggregate, the base semiconductor substrate 10, the buried dielectric layer 12 and the surface semiconductor layer 14 comprise a semiconductor-on-insulator substrate.

The base semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a thickness from about 1 to about 3 millimeters.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the base semiconductor substrate 10. Typically, the buried dielectric layer 12 has a thickness from about 500 to about 2000 angstroms The surface semiconductor layer 14 may comprise any of the several semiconductor materials from which the base semiconductor substrate 10 may be comprised. The surface semiconductor layer 14 and the base semiconductor substrate 10 may comprise either identical or different semiconductor materials with respect to chemical composition, dopant polarity, dopant concentration and crystallographic orientation. Typically, the surface semiconductor layer 14 may have a thickness from about 50 to about 1500 angstroms.

FIG. 1 also shows: (1) a pad dielectric 16 located upon the surface semiconductor layer 14; (2) a hard mask 18 located upon the pad dielectric 16; and (3) a plurality of photoresist layers 20 located upon the hard mask 18.

The pad dielectric 16 may comprise any of several pad dielectric materials. Silicon oxide and silicon oxynitride pad dielectric materials are common. Other pad dielectric materials, that may include, but are not necessarily limited to oxides and oxynitrides of elements other than silicon, are not excluded. Commonly, the pad dielectric 16 comprises a thermal silicon oxide pad dielectric material, although the embodiment and the invention also contemplate the use of other methods, such as but not limited to chemical vapor deposition methods and physical vapor deposition methods, for forming the pad dielectric 16.

The hard mask 18 comprises a hard mask material. Silicon nitride and silicon oxynitride hard mask materials are common hard mask materials, but the use of silicon nitride and silicon oxynitride hard mask materials also by no means limits the embodiment or the invention. The hard mask 18 may in general be formed using methods and materials that are analogous, equivalent or identical to the methods and materials that are used for forming the pad dielectric 16. Typically, the hard mask 18 comprises a silicon oxynitride hard mask material or a silicon oxide hard mask material that has a thickness from about 500 to about 1500 angstroms.

The photoresist layers 20 may comprise any of several photoresist materials. Positive photoresist materials, negative photoresist materials and hybrid (i.e., both positive acting and negative acting) photoresist materials are common. Positive and negative photoresist materials are more particularly common. Typically, the photoresist layers 20 comprise a positive photoresist material or a negative photoresist material that has a thickness from about 2000 to about 5000 angstroms.

Figure 2:
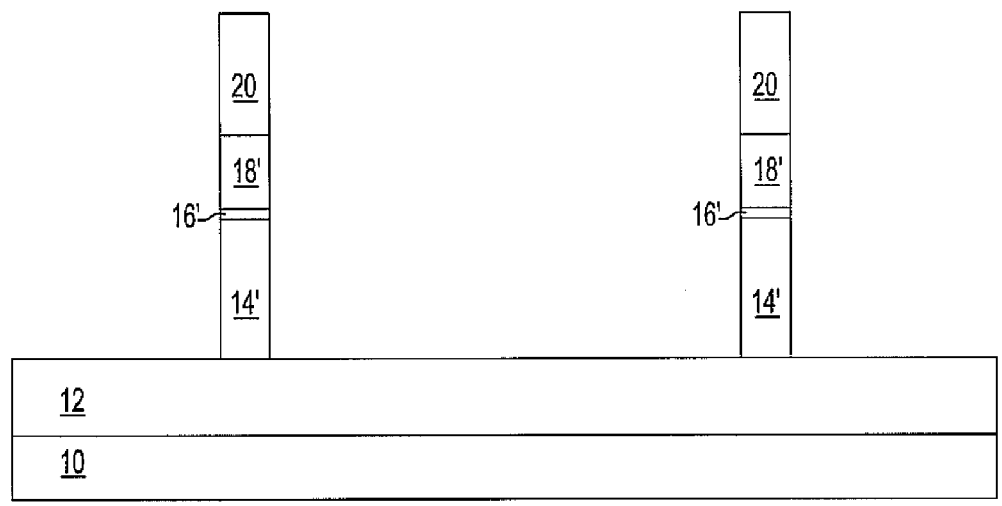

FIG. 2 shows a plurality of hard masks 18' located upon a plurality of pad dielectrics 16' in turn located upon a plurality of semiconductor fins 14' that are etched from the corresponding hard mask 18, pad dielectric 16 and surface semiconductor layer 14, while using the plurality of photoresist layers 20 as etch mask layers. The foregoing etching typically uses a plasma etch method, or a series of plasma etch methods, that uses a series of etchant gas compositions appropriate to the materials from which are comprised the hard mask 18, the pad dielectric 16 and the surface semiconductor layer 14. Generally, silicon containing dielectric materials may be efficiently etched while using a fluorine containing etchant gas composition, while silicon containing semiconductor materials may be efficiently etched using a chlorine containing etchant gas composition. The foregoing plasma etch method, or series of plasma etch methods, will typically comprise an anisotropic plasma, or a series of anisotropic plasmas, that provides nominally straight sidewalls to the hard masks 18', the pad dielectrics 16' and the semiconductor fins 14'. Although not particularly illustrated within FIG. 2, the semiconductor fin 14' stack located at the left hand side of the semiconductor structure of FIG. 2 is intended for eventual fabrication of an n-finFET that will be designated as a second transistor, while the semiconductor fin 14' stack located at the right hand side of the semiconductor structure of FIG. 2 is intended for fabrication of a p-finFET that will be designated as a first transistor.

Figure 3:
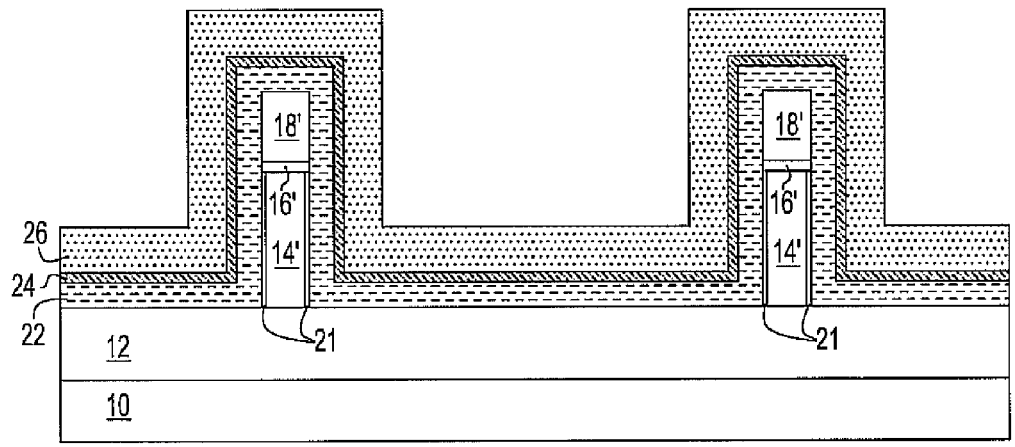

FIG. 3 first shows the results of stripping the photoresist layers 20 from the hard masks 18' within the semiconductor structure of FIG. 2. The photoresist layers 20 may be stripped using methods and materials that are conventional in the semiconductor fabrication art. Included in particular are wet chemical photoresist stripping methods, dry plasma photoresist stripping methods and aggregates of wet chemical photoresist stripping methods and dry plasma photoresist stripping methods.

FIG. 3 next shows first gate dielectrics 21 located upon sidewalls of the semiconductor fins 14'.

The first gate dielectrics 21 may comprise conventional dielectric materials such as oxides, nitrides and oxynitrides of silicon that have a dielectric constant from about 4 (i.e., typically a silicon oxide) to about 8 (i.e., typically a silicon nitride), measured in vacuum. Alternatively, the first gate dielectrics 21 may comprise generally higher dielectric constant dielectric materials having a dielectric constant from about 8 to at least about 100. Such higher dielectric constant dielectric materials may include, but are not necessarily limited to hafnium oxides, hafnium silicates, zirconium oxides, lanthanum oxides, titanium oxides, barium-strontium-titanates (BSTs) and lead-zirconate-titanates (PZTs). The first gate dielectrics 21 may be formed using any of several methods that are appropriate to their material of composition. Non limiting examples include thermal or plasma oxidation or nitridation methods, chemical vapor deposition methods (including atomic layer deposition methods) and physical vapor deposition methods. Typically, the first gate dielectrics 21 comprise a thermal silicon oxide dielectric material that has a thickness from about 5 to about 50 angstroms. As a result of using such a thermal oxidation method, the first gate dielectrics 21 are formed as separated and distinct layers. Alternatively, when the first gate dielectrics 21 comprise a deposited dielectric material rather than a thermally grown dielectric material, the first gate dielectrics 21 are typically formed as a single contiguous layer.

After forming the first gate dielectrics 21, FIG. 3 finally shows a tri-layer stack formed and located upon the resulting semiconductor structure. The tri-layer stack includes a first gate conductor layer 22 located and formed upon the resulting semiconductor structure, an etch stop layer 24 located upon the first gate conductor layer 22 and a first capping layer 26 located upon the etch stop layer 24.

Within the instant embodiment, the first gate conductor layer 22 may comprise any of several gate conductor materials. In particular, first gate conductor layer 22 may comprise materials including but not limited to certain metals, metal alloys, metal nitrides and metal silicides, as well as laminates thereof and composites thereof. The first gate conductor layer 22 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing gate conductor materials may also be formed using any of several methods. Non-limiting examples include salicide methods, chemical vapor deposition methods and physical vapor deposition methods, such as, but not limited to evaporative methods and sputtering methods. Typically, the first gate conductor layer 22 comprises a doped polysilicon material that has a thickness from about 200 to about 500 angstroms.

The etch stop layer 24 may comprise any of several etch stop materials. Conductor etch stop materials, semiconductor etch stop materials and dielectric etch stop materials are common. Dielectric etch stop materials are generally most common. Particular dielectric etch stop materials include silicon oxides, silicon nitrides and silicon oxynitrides that are formed using methods and materials analogous, equivalent or identical to the methods and materials that are used for fabricating the buried dielectric layer 24. Other etch stop materials, as well as methods for fabrication thereof, are not excluded. Typically, the etch stop layer 24 comprises a dielectric etch stop material, such as but not limited to a thermal silicon oxide dielectric etch stop material, that has a thickness from about 30 to about 100 angstroms.

The first capping layer 26 may comprise any of several capping materials. Conductor capping materials, semiconductor capping materials and dielectric capping materials all comprise candidate capping materials. While by no means limiting the embodiment, the first capping layer 26 typically comprises a doped polysilicon conductor capping material analogous, equivalent or identical to the doped polysilicon material from which is comprised the first gate conductor layer 22. Typically, the first capping layer 26 has a thickness from about 300 to about 500 angstroms.

Figure 4:
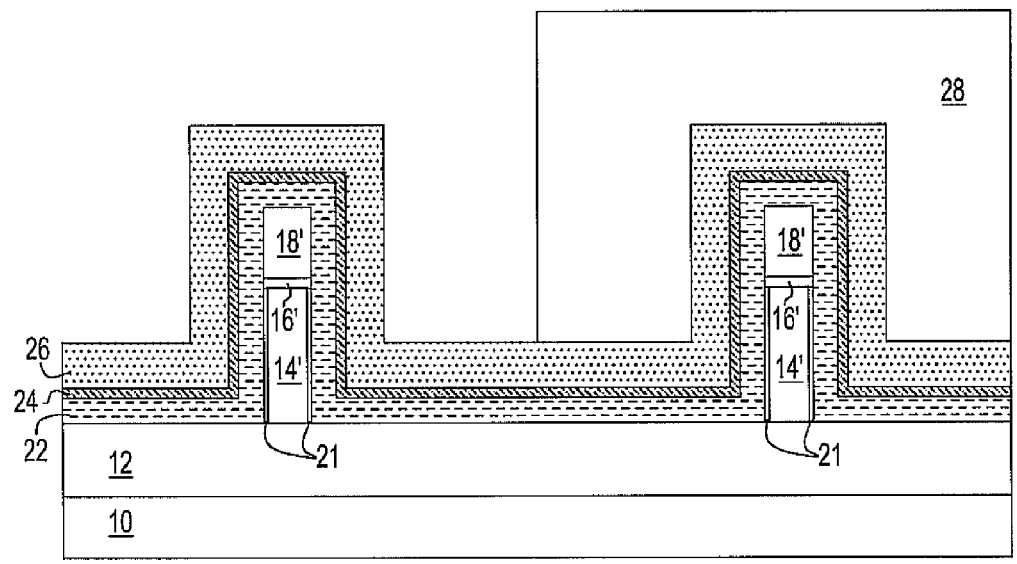

FIG. 4 shows a block mask 28 located covering the right hand side of the semiconductor structure whose schematic cross-sectional diagram is illustrated in FIG. 3.

The block mask 28 typically comprises a photoresist material analogous, equivalent or identical to the photoresist material from which is comprised the photoresist layers 20 that are illustrated in FIG. 1. However, the block mask 28 is formed with generally larger dimensions in comparison with the photoresist layers 20. Positive photoresist materials and negative photoresist materials are again most common for forming the block mask 28, but by no means limit the invention.

Figure 5:
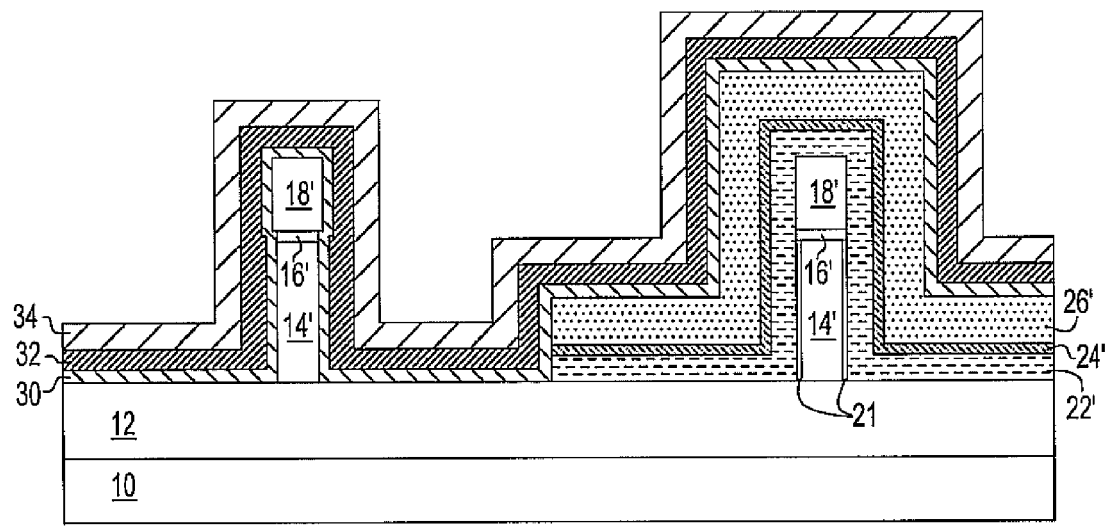

FIG. 5 first shows the results of sequentially etching the capping layer 26, the etch stop layer 24 and the first gate conductor layer 22 while using the block mask 28 as an etch mask, to form a corresponding capping layer 26', etch stop layer 24' and first gate conductor layer 22'. Similarly with related processing steps within the instant embodiment, the foregoing etching is undertaken using a plasma etch method (i.e., typically an anisotropic plasma etch method) that is otherwise generally conventional in the semiconductor fabrication art. Again, typically, a fluorine containing etchant gas composition is used for etching a silicon containing dielectric material, while a chlorine containing etchant gas composition or a bromine containing etchant gas composition is used for etching a silicon containing semiconductor material.

FIG. 5 next shows the results of stripping the block mask 28 from the resulting semiconductor structure. The block mask 28 may be stripped using methods and materials that are used for stripping the photoresist layers 20 from the semiconductor structure whose schematic cross-sectional diagram is illustrated in FIG. 1 to provide in part the semiconductor structure whose schematic cross-sectional diagram is illustrated in FIG. 2.

FIG. 5 finally shows a second tri-layer stack formed and located upon the semiconductor structure that results from etching the first gate conductor layer 22, the etch stop layer 24 and the first capping layer 26 to form the corresponding first gate conductor layer 22', the etch stop layer 24' and the first capping layer 26', and then stripping from the first capping layer 26 the block mask 28. The second tri-layer stack includes: (1) a second gate dielectric 30 located upon all surfaces of the post-etched and post-photoresist stripped semiconductor structure, but in particular upon sidewalls of the left hand semiconductor fin 14'; (2) a second gate conductor layer 32 located upon the second gate dielectric 30; and (3) a second capping layer 34 located upon the second gate conductor layer 32.

The second gate dielectric 30 may comprise a gate dielectric material selected from the same group of gate dielectric materials as the first gate dielectrics 21. However, within the instant embodiment the first gate dielectrics 21 and the second gate dielectric 30 comprise different dielectric materials selected from that group. Similarly, the second gate conductor layer 32 may comprise a gate conductor material selected from the same group of gate conductor materials as the first gate conductor layer 22. However, and also within the context of the instant embodiment, the second gate conductor layer 32 also comprises a different gate conductor material in comparison with the first gate conductor layer 22. Within the instant embodiment, the second gate dielectric 30 typically comprises a higher dielectric constant dielectric material in comparison with the first gate dielectrics 21 that typically comprises a thermal silicon oxide dielectric material. Within the instant embodiment, the second gate conductor layer 32 typically comprises a metal, metal alloy, metal nitride or metal silicide gate conductor material, such as but not limited to a titanium nitride gate conductor material, in comparison with the first gate conductor layer 22' which typically comprises a doped polysilicon gate conductor material. Typically, the second gate dielectric 30 has a thickness from about 5 to about 50 angstroms and the second gate conductor layer 32 has a thickness from about 200 to about 500 angstroms.

Finally, within the context of further disclosure below, the second capping layer 34 will typically comprise a conductor capping material, although the instant embodiment is not necessarily so limited, given the possibility of alternative subsequent etch schemes in comparison with the etch scheme that is described in further detail below. Typically, and for reasons that will become more apparent within the context of further disclosure below, the second capping layer 34 preferably comprises a doped polysilicon capping material. Preferably, the second capping layer 34 has a thickness from about 300 to about 500 angstroms.

Figure 6:
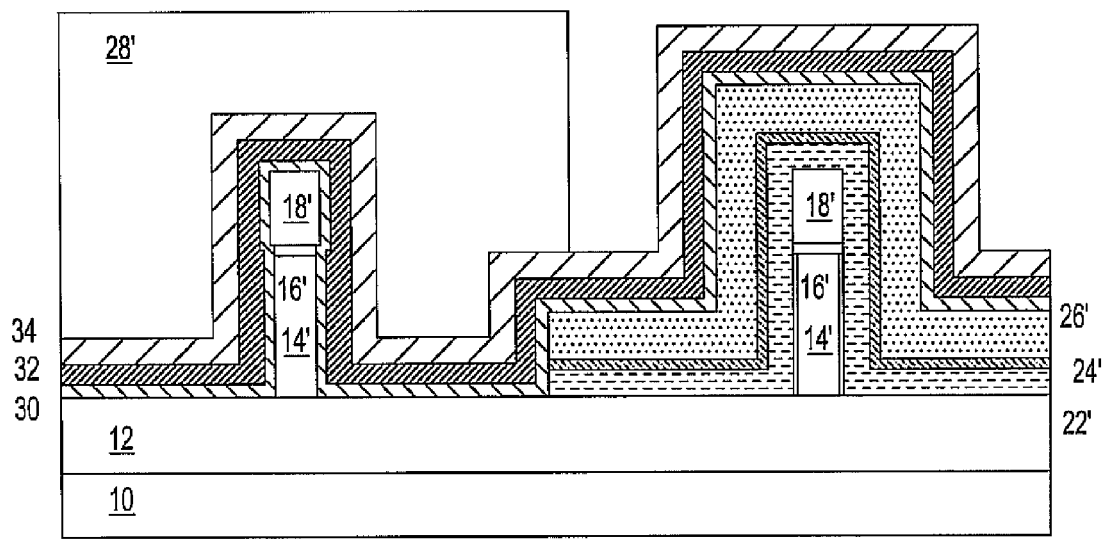

FIG. 6 shows a block mask 28' located upon the left hand side of the semiconductor structure whose schematic cross-sectional diagram is illustrated in FIG. 5. The block mask 28' as illustrated in FIG. 6 is otherwise analogous, equivalent or identical to the block mask 28 that is illustrated in FIG. 4, but located upon a left hand side of the semiconductor structure whose schematic cross-sectional diagram is illustrated in FIG. 5 rather than the right hand side of the semiconductor structure whose schematic cross-sectional diagram is illustrated in FIG. 5. As is illustrated within the schematic cross-sectional diagram of FIG. 6, the block mask 28' is located in a fashion that it covers the step formed by the first gate conductor layer 22', the etch stop layer 24' and the first capping layer 26'.

Figure 7:
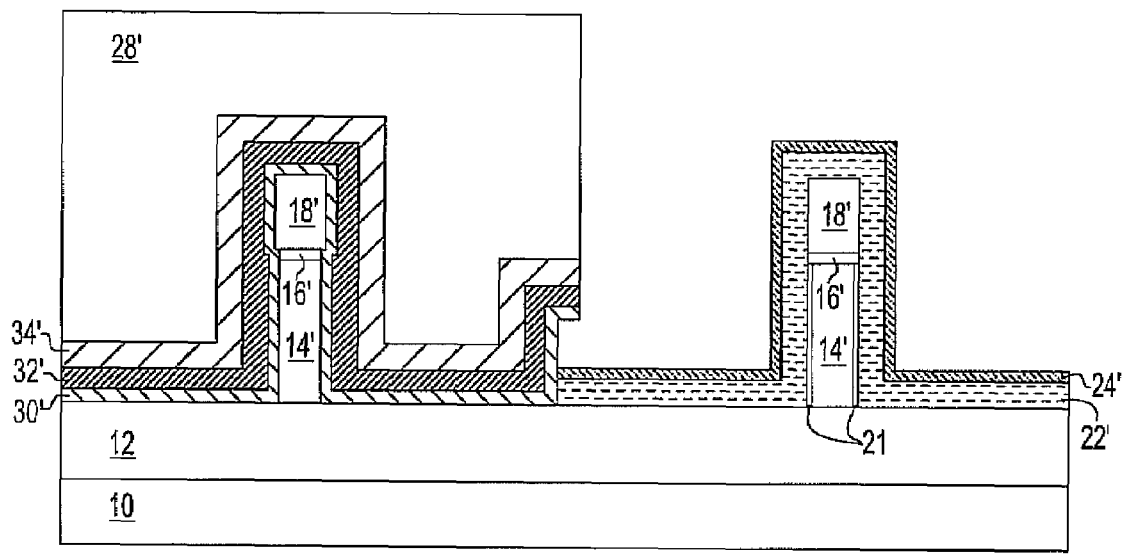

FIG. 7 first shows the results of etching the second capping layer 34, the second gate conductor layer 32 and the second gate dielectric 30 to form a corresponding second capping layer 34' (in part), a second gate conductor layer 32' and second gate dielectric 30'. The foregoing etching may be effected using methods and materials that are otherwise generally conventional in the semiconductor fabrication art. Included in particular are dry plasma etch methods that use an appropriate etchant gas composition with respect to the materials from which are formed the second capping layer 34, the second gate conductor layer 32 and the second gate dielectric 30.

FIG. 7 also shows the results of stripping the first capping layer 26' from the etch stop layer 24'. Stripping of the first capping layer 26' from the etch stop layer 24' is typically undertaken using an isotropic etchant that provides for an undercut of the second capping layer 34' beneath the block mask 28' Such an isotropic etchant typically comprises a wet chemical etchant, such as an acidic wet chemical acidic etchant. Under certain circumstances, however, dry plasma etchants may also exhibit isotropic characteristics.

Figure 8:
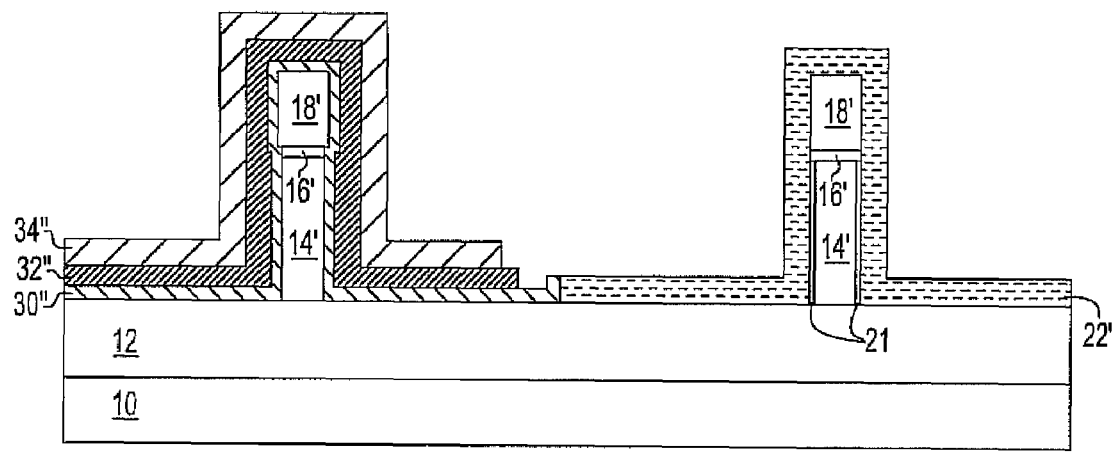

FIG. 8 first shows the results of isotropically etching portions of the second gate dielectric 30' and the second gate conductor layer 32' exposed beneath the block mask 28' that is illustrated in FIG. 7 to form the second gate dielectric 30" and the second gate conductor layer 32". Such isotropic etching may be effected using methods and materials that are otherwise generally conventional in the semiconductor fabrication art. Included in particular are wet chemical etch methods and dry plasma etch methods.

FIG. 8 next shows the results of isotropically stripping completely the first capping layer 26' from the etch stop layer 24', and partially etching an exposed portion of the second capping layer 34' beneath the block mask 28' to form a second capping layer 34'". The foregoing isotropic stripping and isotropic etching may be effected using an isotropic etchant as is similarly also conventional in the semiconductor fabrication art. Included in particular are wet chemical stripping methods and materials, and dry plasma stripping methods and materials.

FIG. 8 finally shows the results of stripping the block mask 28' from the second capping layer 34" and the etch stop layer 24' from the first gate conductor layer 22' to provide the semiconductor structure that is illustrated in FIG. 8. The foregoing stripping of the block mask 28' and the etch stop layer 24' may also be effected using methods and materials that are generally conventional in the semiconductor fabrication art. Also included in particular, but also not limiting the embodiment or the invention, are wet chemical stripping methods and materials, and dry plasma stripping methods and materials.

Figure 9:
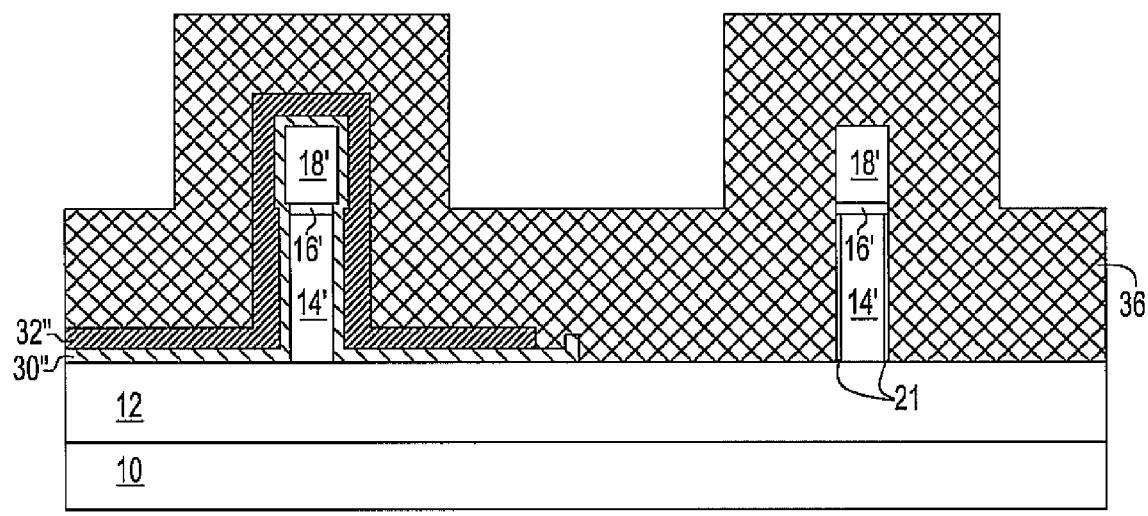

FIG. 9 shows a gate conductor capping layer 36 located upon the semiconductor structure of FIG. 8. In general the gate conductor capping layer 36 may comprise any of the several materials disclosed above from which is comprised the first gate conductor layer 22 and the second gate conductor layer 32. However, within the context of the instant embodiment when the first gate conductor layer 22 comprises a doped polysilicon conductor material and the second capping layer 34" also comprises a doped polysilicon conductor material, the gate conductor capping layer 36 preferably also comprises a doped polysilicon material that in effect incorporates the first gate conductor layer 22' and the second capping layer 34". Typically, the gate conductor capping layer 36 comprises a doped polysilicon material that has a thickness from about 300 to about 700 angstroms.

Figure 10A:
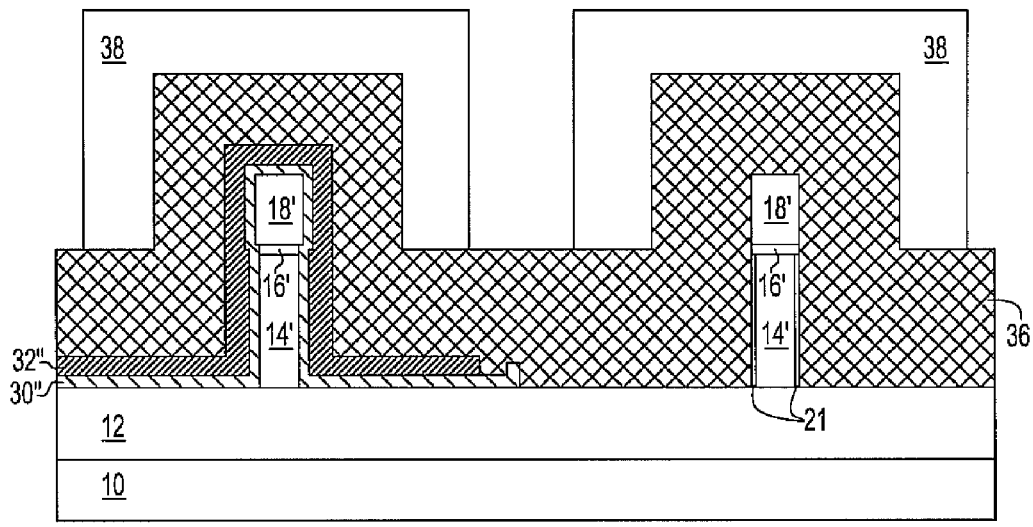
Figure 10B:
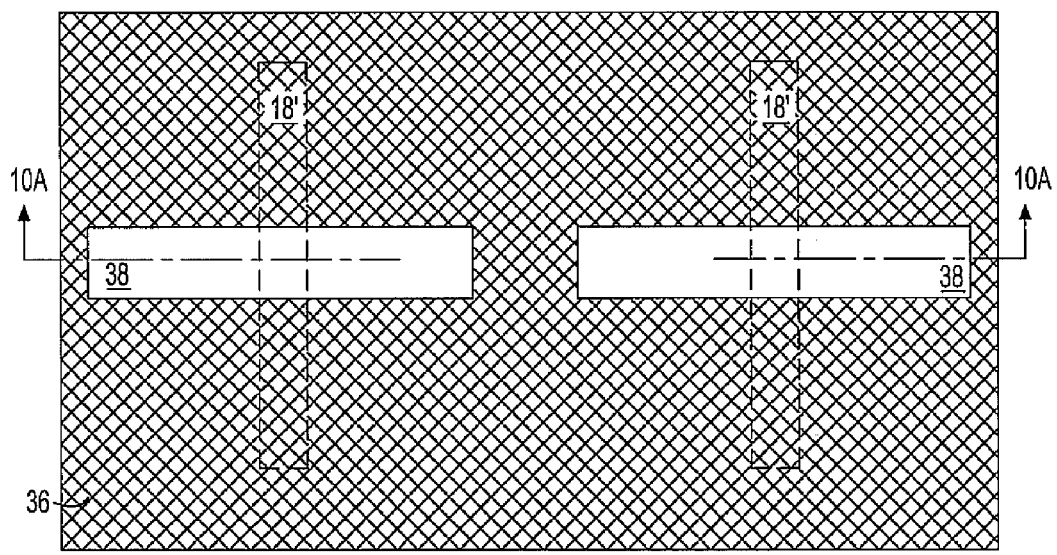

FIG. 10A and FIG. 10B show a schematic cross-sectional diagram and a schematic plan-view diagram illustrating the results of further processing of the semiconductor structure whose schematic cross-sectional diagram is illustrated in FIG. 9.

FIG. 10A and FIG. 10B show a plurality of mask layers 38 located upon the gate conductor capping layer 36 and nominally centered over each of the semiconductor fins 14'.

The plurality of mask layers 38 may comprise photoresist materials and be formed using methods, that are otherwise analogous or equivalent to the photoresist materials and methods that are used for forming the block masks 28 and 28', and the photoresist layers 20. However, the dimensions of the mask layers 38, while in some instances similar to the photoresist layers 20, may in general be smaller than the aerial dimensions of the block masks 28 and 28'.

Figure 11A:
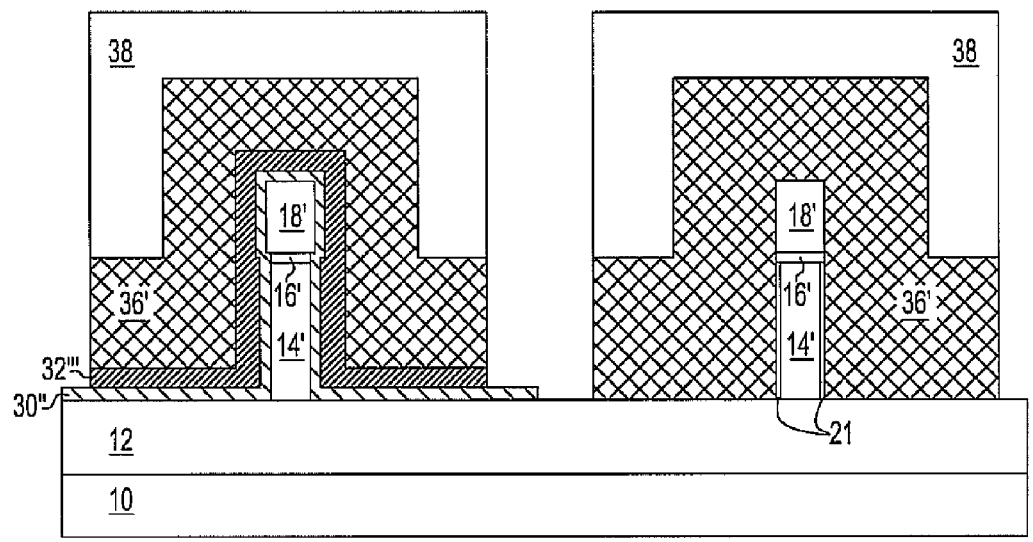
Figure 11B:
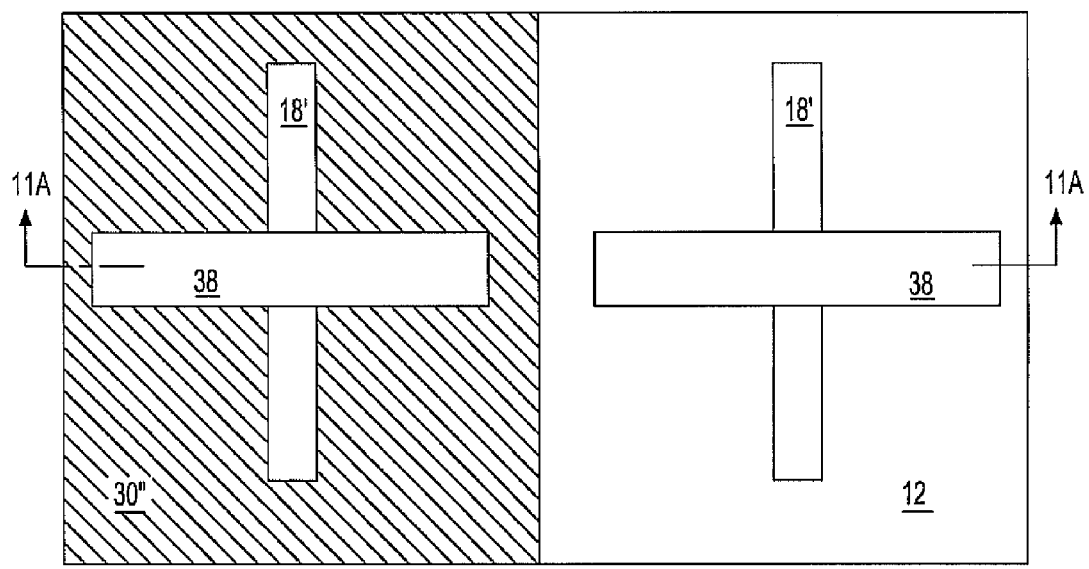

FIG. 11A and FIG. 11B show a schematic cross-sectional diagram and a schematic plan-view diagram illustrating the results of further processing of the semiconductor structure whose schematic cross-sectional diagram and schematic plan-view diagram are illustrated in FIG. 10A and FIG. 10B.

FIG. 11A and FIG. 11B show the results of patterning the gate conductor capping layer 36 and the second gate conductor layer 32" to form plurality of gate conductor capping layers 36' located one each over each of the plurality of semiconductor fins 14' and a second gate conductor layer 32'" located over the left hand semiconductor fin but not the right hand semiconductor fin 14'. The foregoing etching is undertaken using methods and materials that are generally conventional in the semiconductor fabrication art. Included in particular are anisotropic dry plasma etch methods that provide generally straight sidewalls to the gate conductor capping layers 36' and the second gate conductor layer 32'''.

Figure 12A:
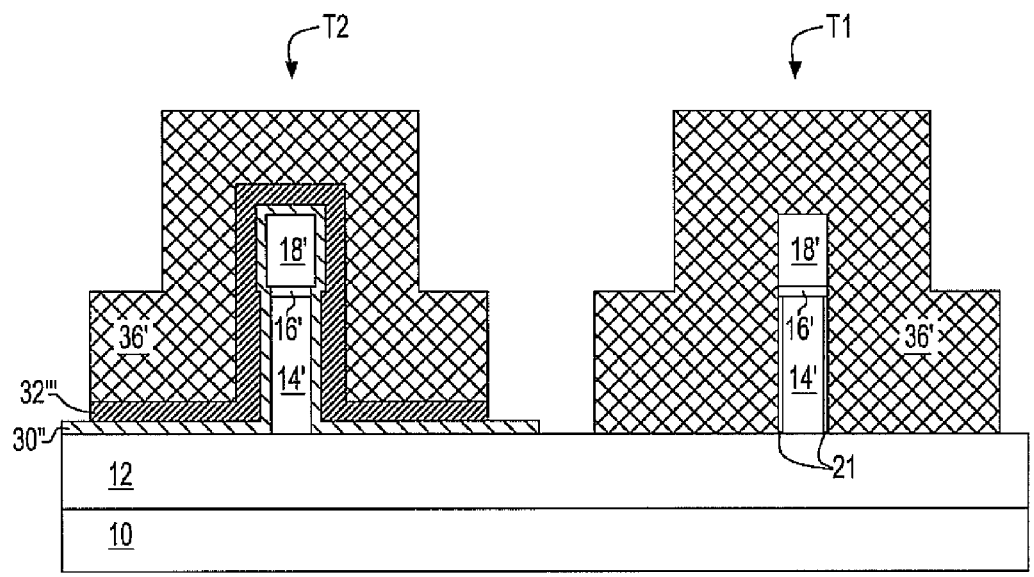
Figure 12B:
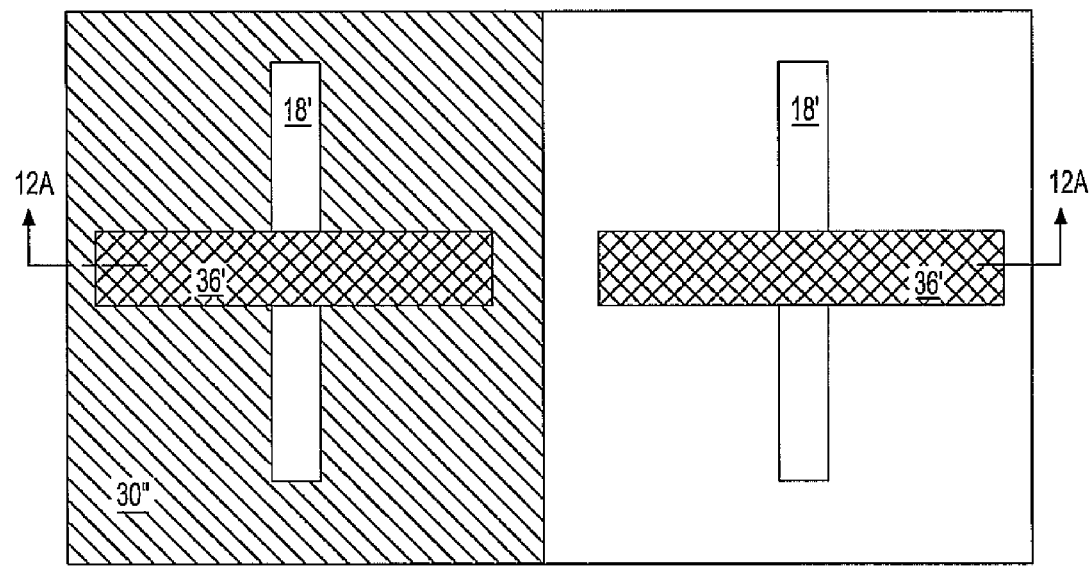
Figure 13A:
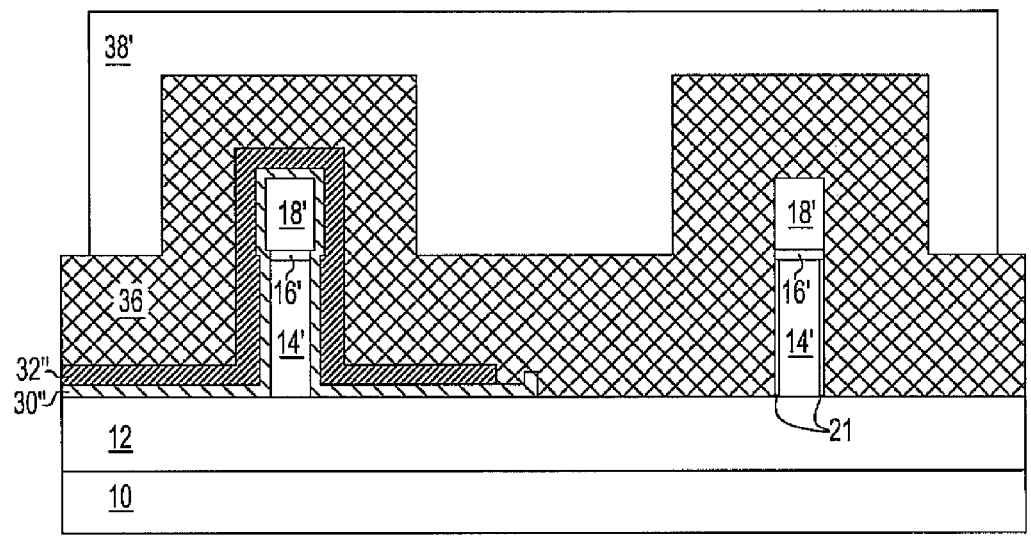
FIG. 13A to 15B show a series of schematic cross-sectional diagrams illustrating the results of progressive stages in fabricating a semiconductor structure in accordance with a second embodiment of the invention.
Figure 13B:
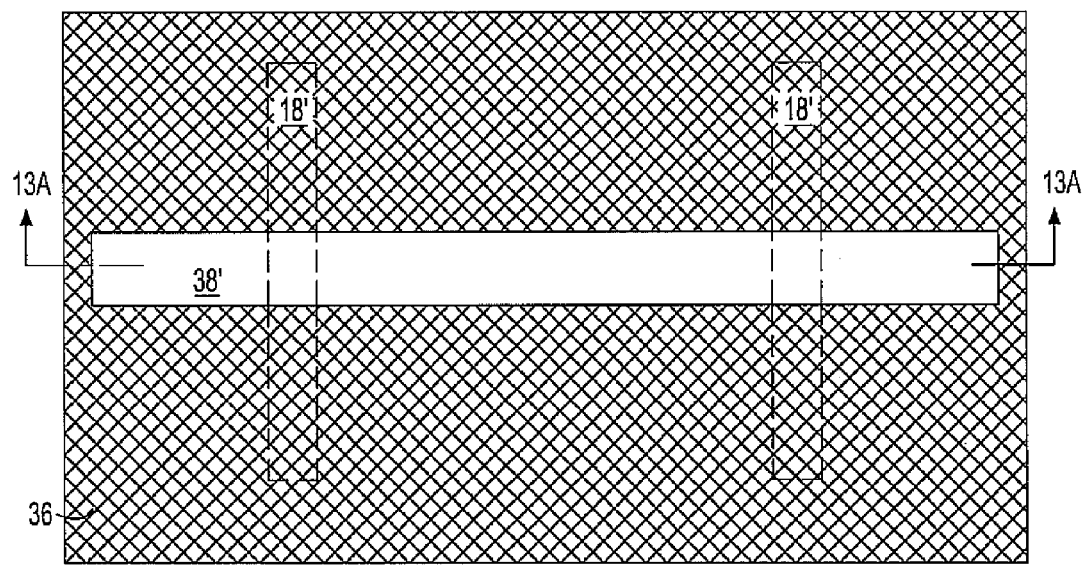
Figure 14A:
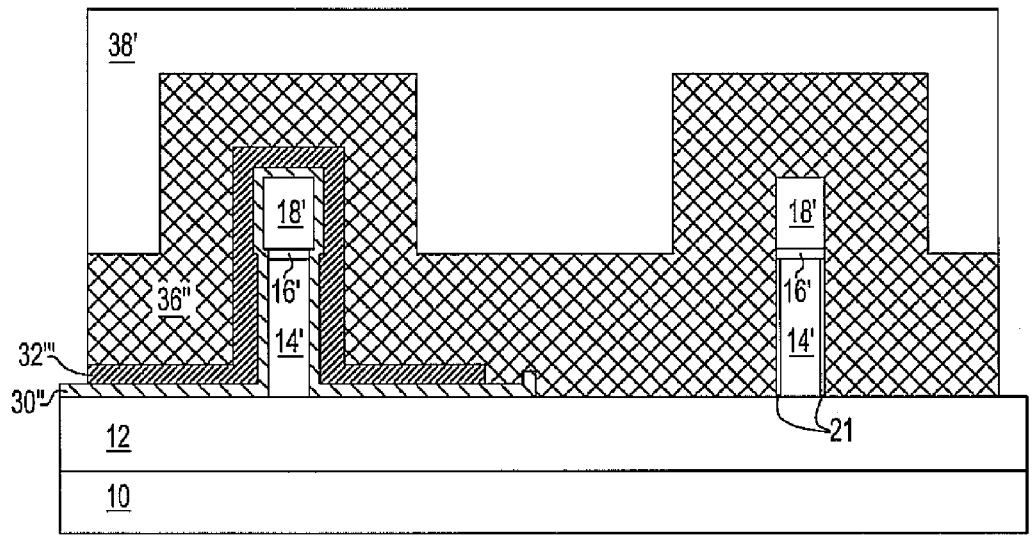
Figure 14B:
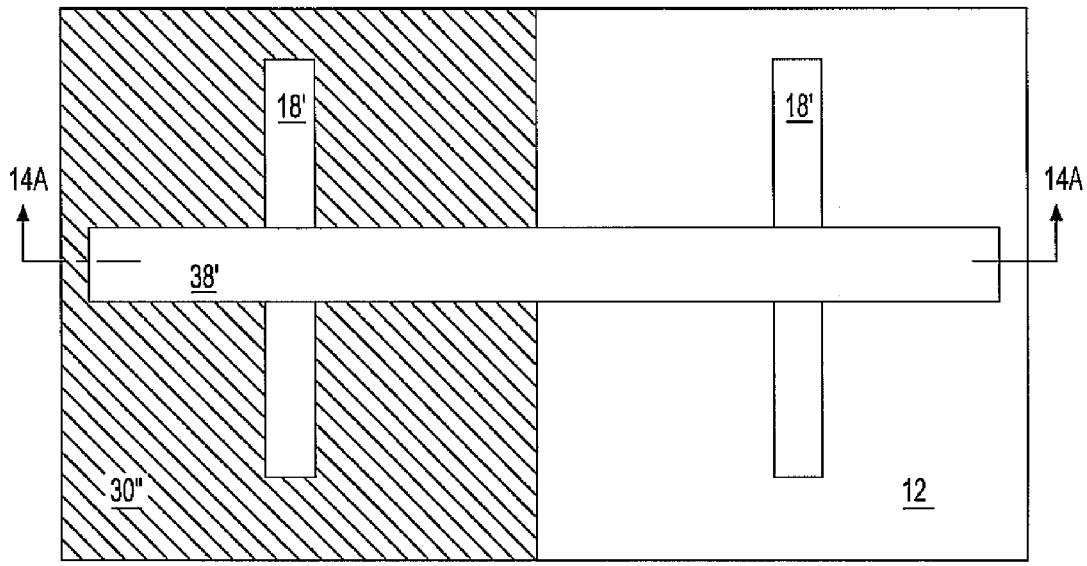

FIG. 12A and FIG. 12B show a schematic cross-sectional diagram and a schematic plan-view diagram illustrating the results of further processing of the semiconductor structures whose schematic cross-sectional diagram and schematic plan-view diagram are illustrated in FIG. 11A and FIG. 11B.

FIG. 12A and FIG. 12B show the results of stripping the mask layers 38 from the semiconductor structure of FIG. 11A and FIG. 11B, and in particular from the gate conductor capping layers 36'. The mask layers 38 may be stripped using methods and materials that are generally conventional in the semiconductor fabrication art. Included in particular are wet chemical etch methods, dry plasma etch methods and aggregates of wet chemical etch methods and dry plasma etch methods.

As is understood by a person skilled in the art, the semiconductor structures of FIG. 12A and FIG. 12B may be further processed to provide fully functional finFET devices. Such further processing may include, but is not necessarily limited to, ion implantation processing to provide source and drain regions within the semiconductor fins 14', where the source and drain regions are separated channel regions within the semiconductor fins 14' that are aligned beneath the gate conductor capping layers 36'.

FIG. 12A and FIG. 12B show a schematic cross-sectional diagram and a schematic plan-view diagram of a semiconductor structure in accordance with an embodiment of the invention that comprises a first embodiment of the invention. The semiconductor structure includes a plurality of finFET structures and in particular a first finFET structure T1 and a second finFET structure T2. Preferably, the first finFET structure T1 is a p-finFET and the second finFET structure is an n-finFET to thus provide a CMOS finFET structure. Within this particular embodiment, the first finFET structure T1 includes a first gate dielectric 21 that preferably comprises a silicon oxide dielectric material, and a first gate electrode that comprises only the gate conductor capping layer 36' that preferably comprises a doped polysilicon gate conductor material. Within this particular embodiment, the second finFET structure T2 includes a second gate dielectric 30" different than the first gate dielectric 21 (i.e., typically comprising a higher dielectric constant dielectric material), and a second gate electrode that comprises a second gate conductor layer 32''' (i.e., that typically comprises a titanium nitride gate conductor material) upon which is located another gate conductor capping layer 36'. Thus this particular embodiment provides a CMOS finFET structure where an n-finFET and a p-finFET have both a different gate dielectric material composition and a different gate electrode material composition.

As is understood by a person skilled in the art, such a differing gate electrode material composition and gate dielectric material composition may provide for enhanced performance optimization of the individual n-finFET T2 and p-finFET T1 within the finFET CMOS structure whose schematic cross-sectional diagram is illustrated in FIG. 12A and FIG. 12B.

FIG. 13A to FIG. 15B show a series of schematic cross-sectional diagrams and schematic plan-view diagrams illustrating the results of progressive stages in fabricating a semiconductor structure in accordance with another embodiment of invention. This other embodiment of the invention comprises a second embodiment of the invention.

FIG. 13A to FIG. 15B correspond generally with FIG. 10A to FIG. 12B but wherein the mask layers 38 that are illustrated in FIG. 10A to FIG. 11B have been replaced by a single mask layer 38' that covers both of the semiconductor fins 14'. As a result of using the mask layer 38' rather than the plurality of mask layers 38, this second embodiment provides a single gate electrode capping layer 36" that spans between the semiconductor fins 14', as illustrated most particularly in FIG. 15A and FIG. 15B.

Figure 15A:
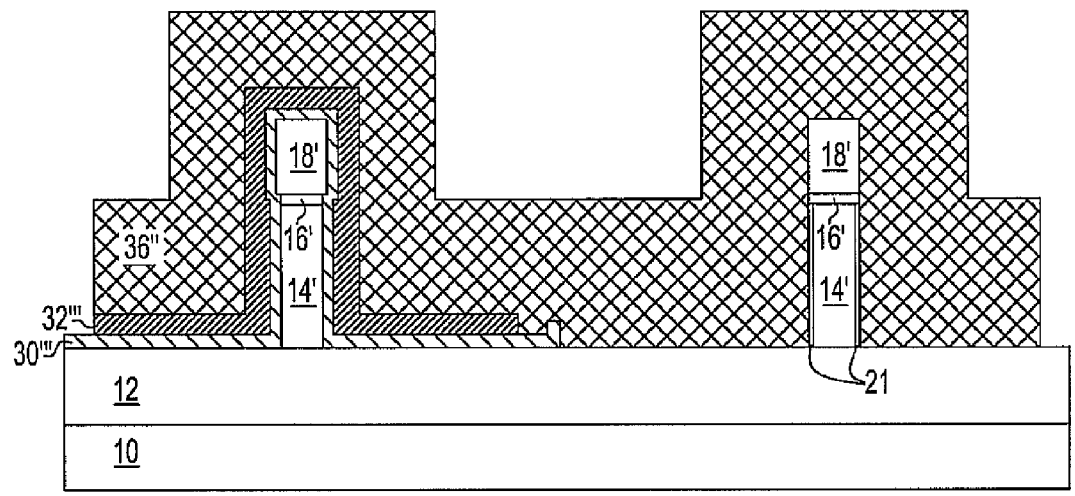
Figure 15B:
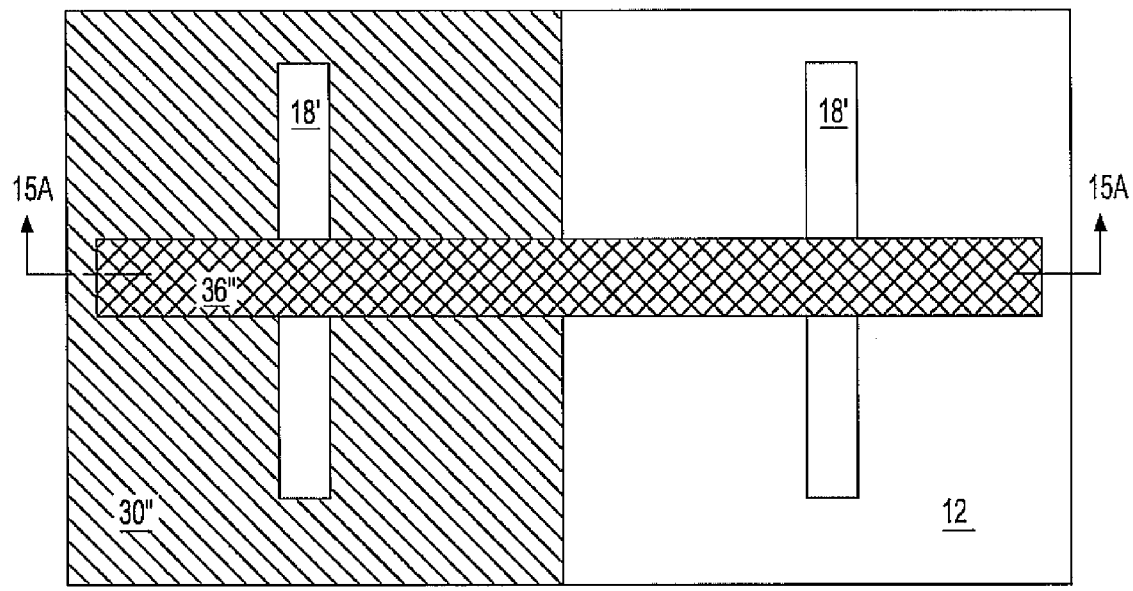

FIG. 15A and FIG. 15B show a schematic cross-sectional diagram and a schematic plan-view diagram of a semiconductor structure in accordance with a second embodiment of the invention. Similarly with the first embodiment as is illustrated in FIG. 12A and FIG. 12B, the second embodiment is also preferably comprises an n-finFET and a p-finFET to provide a CMOS finFET structure. Within the finFET CMOS structure that is illustrated in FIG. 15A and FIG. 15B, an n-finFET T2 has at least one, and preferably both, a different gate dielectric composition and a different gate electrode composition, in comparison with a p-finFET T1.

As is illustrated in FIG. 15A and FIG. 15B, within the finFET CMOS structure, the n-finFET T2 includes a second gate dielectric 30" that preferably comprises a higher dielectric constant dielectric material than the first gate dielectrics 21 that are included within the p-finFET T1. Similarly, the n-finFET T2 also comprises a second gate electrode that comprises a second gate conductor layer 32''' and the contiguous gate conductor capping layer 36" while the p-finFET T1 comprises a first gate that comprises only the contiguous gate conductor capping layer 36". Thus, within the second embodiment as well as the first embodiment, both the gate dielectrics and the gate electrodes of the n-finFET and the p-finFET comprise different materials.

The semiconductor structure in accordance with the second embodiment of the invention provides value in comparison with the semiconductor structure in accordance with the first embodiment insofar as the shorted gate electrodes through the contiguous gate electrode capping layer 36" may be useful in forming ring oscillators, inverters, synchronous random access memory (SRAM) and related semiconductor devices. As noted above, either of the embodiments disclosed above is desirable within the context of a CMOS structure insofar as individual n-finFET structures and p-finFET structures therein include at least one, and preferably both, of different gate dielectric materials and different gate electrode materials. The different gate dielectric materials and different gate electrode materials provide an opportunity for efficiently designing and optimizing an n-finFET with different operating parameters in comparison with a p-finFET.

The preferred embodiments of the invention are illustrative of the invention rather than limiting of the invention. Revisions and modifications may be made to methods materials, structures and dimensions of a CMOS finFET structure in accordance with the preferred embodiments, while still providing a semiconductor structure and method for fabrication thereof in accordance with the invention, further in accordance with the accompanying claims.

What is claimed is:

1. A semiconductor structure comprising:
   a first finFET including a first semiconductor fin located over a substrate, a first gate dielectric located upon the first semiconductor fin and a first gate electrode located to straddle the first semiconductor fin and to provide a first channel region beneath the first gate electrode that separates a plurality of source and drain regions within the first semiconductor fin; and
   a second finFET including a second semiconductor fin located over the substrate, a second gate dielectric located upon the second semiconductor fin and a second gate electrode located to straddle the second semiconductor fin and to provide a second channel region beneath the second gate electrode that separates a plurality of source and drain regions within the second semiconductor fin, wherein each of the first finFET and the second finFET comprises an n-finFET and one of the first gate dielectric or the second gate dielectric is located on the sidewalls and atop its corresponding semiconductor fin, while the other of the first gate dielectric or the second gate dielectric is located only on the sidewalls of its corresponding semiconductor fin and where at least either:
    the first gate dielectric and the second gate dielectric comprise different gate dielectric materials; or
    the first gate electrode and the second gate electrode comprise different gate electrode materials.

2. The CMOS structure of claim 1 wherein the substrate comprises a dielectric surface.

3. The CMOS structure of claim 1 wherein the substrate comprises a dielectric surface layer located upon a semiconductor substrate.

4. The CMOS structure of claim 1 wherein the first gate dielectric and the second gate dielectric comprise different gate dielectric materials.

5. The CMOS structure of claim 1 wherein the first gate electrode and the second gate electrode comprise different gate electrode materials.

6. The CMOS structure of claim 1 wherein:
the first gate dielectric and the second gate dielectric comprise different gate dielectric materials; and
the first gate electrode and the second gate electrode comprise different gate electrode materials.

7. The CMOS structure of claim 1 wherein the first gate electrode is contiguous with the second gate electrode.

8. The CMOS structure of claim 1 wherein the first gate electrode is not contiguous with the second gate electrode.

9. A semiconductor structure comprising:
a first finFET including a first semiconductor fin located over a substrate, a first gate dielectric located upon the first semiconductor fin and a first gate electrode located to straddle the first semiconductor fin and to provide a first channel region beneath the first gate electrode that separates a plurality of source and drain regions within the first semiconductor fin; and
a second finFET including a second semiconductor fin located over the substrate, a second gate dielectric located upon the second semiconductor fin and a second gate electrode located to straddle the second semiconductor fin and to provide a second channel region beneath the second gate electrode that separates a plurality of source and drain regions within the second semiconductor fin, wherein each of the first finFET and the second finFET comprises a p-finFET and one of the first gate dielectric or the second gate dielectric is located on the sidewalls and atop its corresponding semiconductor fin, while the other of the first gate dielectric or the second gate dielectric is located only on the sidewalls of its corresponding semiconductor fin and where at least either:
    the first gate dielectric and the second gate dielectric comprise different gate dielectric materials; or
    the first gate electrode and the second gate electrode comprise different gate electrode materials.

10. A method for fabricating a semiconductor structure comprising:
forming over a substrate a first finFET that includes a first semiconductor fin formed over the substrate, a first gate dielectric formed upon the first semiconductor fin and a first gate electrode formed to straddle the first semiconductor fin and to provide a first channel region beneath the first gate electrode that separates a plurality of source and drain regions within the first semiconductor fin; and
forming over the substrate a second finFET that includes a second semiconductor fin formed over the substrate, a second gate dielectric formed upon the second semiconductor fin and a second gate electrode formed to straddle the second semiconductor fin and to provide a second channel region beneath the second gate electrode that separates a plurality of source and drain regions within the second semiconductor fin, wherein each of the first finFET and the second finFET comprises an n-finFET or a n-finFET and one of the first gate dielectric or the second gate dielectric is located on the sidewalls and atop its corresponding semiconductor fin, while the other of the first gate dielectric or the second gate dielectric is located only on the sidewalls of its corresponding semiconductor fin and where at least either:
    the first gate dielectric and the second gate dielectric comprise different gate dielectric materials; or
    the first gate electrode and the second gate electrode comprise different gate electrode materials.

11. The method of claim 10 wherein the forming over the substrate the first finFET and the second finFET provides the first gate electrode separate from the second gate electrode.

12. The method of claim 10 wherein the forming over the substrate the first finFET and the second finFET provides the first gate electrode contiguous with the second gate electrode.

13. A method for fabricating a semiconductor structure comprising:
forming a first semiconductor fin and a second semiconductor fin over a substrate;
forming a first gate dielectric upon the first semiconductor fin and first gate electrode upon the first gate dielectric to define the locations of a channel and a plurality of source and drain regions within the first semiconductor fin;
forming a second gate dielectric different than the first gate dielectric upon the second semiconductor fin and a second gate electrode different than the first gate electrode upon the second gate dielectric to define the locations of a channel and a plurality of source and drain regions within the second semiconductor fin, wherein one of the first gate dielectric or the second gate dielectric is located on the sidewalls and atop its corresponding semiconductor fin, while the other of the first gate dielectric or the second gate dielectric is located only on the sidewalls of its corresponding semiconductor fin and wherein:
the first semiconductor fin is included within a p-finFET;
the first gate dielectric comprises a comparatively low dielectric constant material;
the first gate electrode does not include a metal material;
the second semiconductor fin is included within an n-finFET;
the second gate dielectric comprises a comparatively high dielectric constant material; and
the second gate electrode includes a metal material.

14. The method of claim 13 wherein the first semiconductor fin is formed simultaneously with the second semiconductor fin.

15. The method of claim 13 wherein the first gate is separate from the second gate.

16. The method of claim 13 wherein the first gate is contiguous with the second gate.

* * * * *